United States Patent
Mohanty

(10) Patent No.: US 9,478,435 B2
(45) Date of Patent: Oct. 25, 2016

(54) METHOD FOR DIRECTED SELF-ASSEMBLY AND PATTERN CURING

(71) Applicant: Tokyo Electron Limited, Minato-ku, Tokyo (JP)

(72) Inventor: Nihar Mohanty, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/797,394

(22) Filed: Jul. 13, 2015

(65) Prior Publication Data
US 2016/0042971 A1  Feb. 11, 2016

Related U.S. Application Data

(60) Provisional application No. 62/034,573, filed on Aug. 7, 2014.

(51) Int. Cl.
*H01L 21/311* (2006.01)
*H01L 21/3105* (2006.01)

(52) U.S. Cl.
CPC ... *H01L 21/31138* (2013.01); *H01L 21/31058* (2013.01); *H01L 21/31144* (2013.01)

(58) Field of Classification Search
CPC .................. H01L 21/31138; H01L 21/31058; H01L 21/31144; G03F 7/004
See application file for complete search history.

(56) References Cited

U.S. PATENT DOCUMENTS

2007/0299239 A1  12/2007  Weigel et al.
2011/0117744 A1  5/2011  Ito

OTHER PUBLICATIONS

Office Action mailed Aug. 5, 2016 in corresponding Taiwan Patent Application No. 104125048 (with an English translation) (12 pages).

*Primary Examiner* — Nadine Norton
*Assistant Examiner* — Mahmoud Dahimene
(74) *Attorney, Agent, or Firm* — Rothwell, Figg, Ernst & Manbeck, P.C.

(57) ABSTRACT

Techniques disclosed herein include methods for DSA patterning and curing of DSA patterns. Techniques include curing phase-separated block copolymers using vacuum ultraviolet (VUV) light exposure at wavelengths from about 100 nanometers to 170 nanometers. VUV light can be generated using a plasma process system and from energizing various VUV-generating process gasses. A VUV curing step is executed (fully or partially) prior to executing an etch process to etch away one of the block copolymers. Such VUV exposure can selectively harden one block copolymer while weakening another block copolymer. This hardening and weakening increases etch selectivity enabling more effective etching and results in better patterns.

17 Claims, 3 Drawing Sheets

METHOD FOR DIRECTED SELF-ASSEMBLY AND PATTERN CURING

CROSS REFERENCE TO RELATED APPLICATIONS

The present application claims the benefit of U.S. Provisional Patent Application No. 62/034,573, filed on Aug. 7, 2014, entitled "Method for Directed Self-Assembly and Pattern Curing," which is incorporated herein by reference in its entirety.

BACKGROUND OF THE INVENTION

Techniques herein relate to methods of fabricating semiconductors including methods for patterning substrates.

Fabricating semiconductor devices includes patterning a wafer surface to be able to create various trenches, holes, and openings in underlying layers. Currently there are challenges with using lithographic tools to create patterns having critical dimensions to meet design specifications. Due to the resolution limitations of patterning photoresists, patterns developed from photoresists do not have lines, trenches, and holes that are sufficiently small to meet design specifications. One technique to shrink patterns to desired dimensions is known as directed self-assembly (DSA).

Directed Self-Assembly (DSA) is a block copolymer process that uses a manufactured polymer that consists of two blocks that are connected. With proper activation, the two (or more) block copolymers will micro phase separate into individual blocks. Conceptually this is similar to how oil can be attached to water via soap. Typically oil and water to not mix but can be held together with certain chemicals, but with these binding chemicals removed or deactivated, oil and water will separate. Likewise, two different blocks in a block copolymer mixture will repel each other, while other blocks can be attracted to themselves. Activation is typically executed via heat energy which causes block copolymer separation on a nanoscale based on various polymer parameters. This phase separation causes nanometer-sized structures to be formed. Typically this is an alternating or repeating pattern of structures being formed. For example, alternating lines of block copolymer can be formed or assembled. Also, one block copolymer can form cylinders while the second block copolymer forms around the cylinders. Using DSA, cylinder structures can be created based on Kai the Flory interaction parameter and N—the statistical molecular weight and the volume. When DSA is coupled with a photoresist pattern (or other pattern) sub-resolution structures can be formed. This is possible because multiple lines or cylinders can be formed within feature dimensions defined by a photoresist pattern. Accordingly, patterned dimensions provided by a photoresist pattern can be shrunk to various design specifications.

SUMMARY

Although directed self-assembly (DSA) can shrink various line dimensions, there are challenges with successful execution of DSA patterning. One challenge with implementing DSA-based patterning involves the development of a DSA pattern that enables selective etching one block copolymer while leaving a second block copolymer. For example, it is challenging to generate a usable pattern by etching of polymethyl methacrylate (PMMA) domains (a first block copolymer) while leaving polystyrene (PS) domains (a second block copolymer) intact. For line-space patterns in particular, plasma etch is preferred over the wet etch process for block copolymer removal processes. This preference is a result of etch removal using liquid chemistry causing collapse of line-space patterns. Such collapse can be due in part to high capillary forces during wet etch processes. Thus, conventional wet etch copolymer removal techniques are not reliable. Removal of one block copolymer domain by dry etching also has challenges. For example, conventionally there is poor etch selectivity between PS and PMMA domains. As a result, a degraded or weakened pattern is formed that is ineffective for subsequent pattern transfer.

Techniques disclosed herein include methods for DSA patterning and curing of DSA patterns. Techniques include curing phase-separated block copolymers using vacuum ultraviolet (VUV) light exposure at wavelengths from about 100 nanometers to 170 nanometers. VUV light can be generated using a plasma processing system and from energizing various VUV-generating process gasses. A VUV curing step is executed (fully or partially) prior to executing an etch process to etch away one of the block copolymers. Such VUV exposure can selectively harden one block copolymer while weakening another block copolymer, as discovered herein. Such a result can apply to selected copolymers even when both are organic polymers. This hardening and weakening increases etch selectivity enabling more effective etching, which results in better patterns. Resulting patterns can be stronger as well as have better line edge roughness (LER) as compared to DSA patterns without benefiting from the curing techniques disclosed herein.

One embodiment includes a method of processing a substrate. The method includes positioning a substrate on a substrate holder of a plasma processing system. The substrate has a micro phase-separated pattern of block copolymers formed by directed self-assembly (DSA). A first process gas is flowed into a plasma processing chamber of the plasma processing system. The first process gas is a gas that generates vacuum ultra violet radiation in a plasma state. The substrate is irradiated with vacuum ultra violet radiation originating from plasma generated using the first process gas such that a first block copolymer increases in hardness and a second block copolymer decreases in hardness as compared to respective hardness values prior to exposure to vacuum ultra violet radiation. A second process gas is flowed into the plasma processing chamber. The second process gas is a gas that generates etchants in a plasma state. An etch process is executed that exposes the substrate to plasma products generated from the second process gas such that at least a portion of the second block copolymer is etched and removed from the substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques disclosed herein include methods for DSA patterning and curing of DSA patterns. Techniques include curing phase-separated block copolymers using vacuum ultraviolet (VUV) light exposure at wavelengths from about 100 nanometers to 170 nanometers. VUV light can be generated using a plasma process system and from energizing various VUV-generating process gasses. A VUV curing step is executed (fully or partially) prior to executing an etch process to etch away one of the block copolymers. Such VUV exposure can selectively harden one block copolymer while weakening another block copolymer, even when both copolymers are organic polymers. This hardening and weakening increases etch selectivity enabling more effective etching and results in better patterns. Such resulting patterns can be stronger as well as have better line edge roughness (LER) as compared to DSA patterns without benefiting from the curing techniques disclosed herein.

Figure 1:
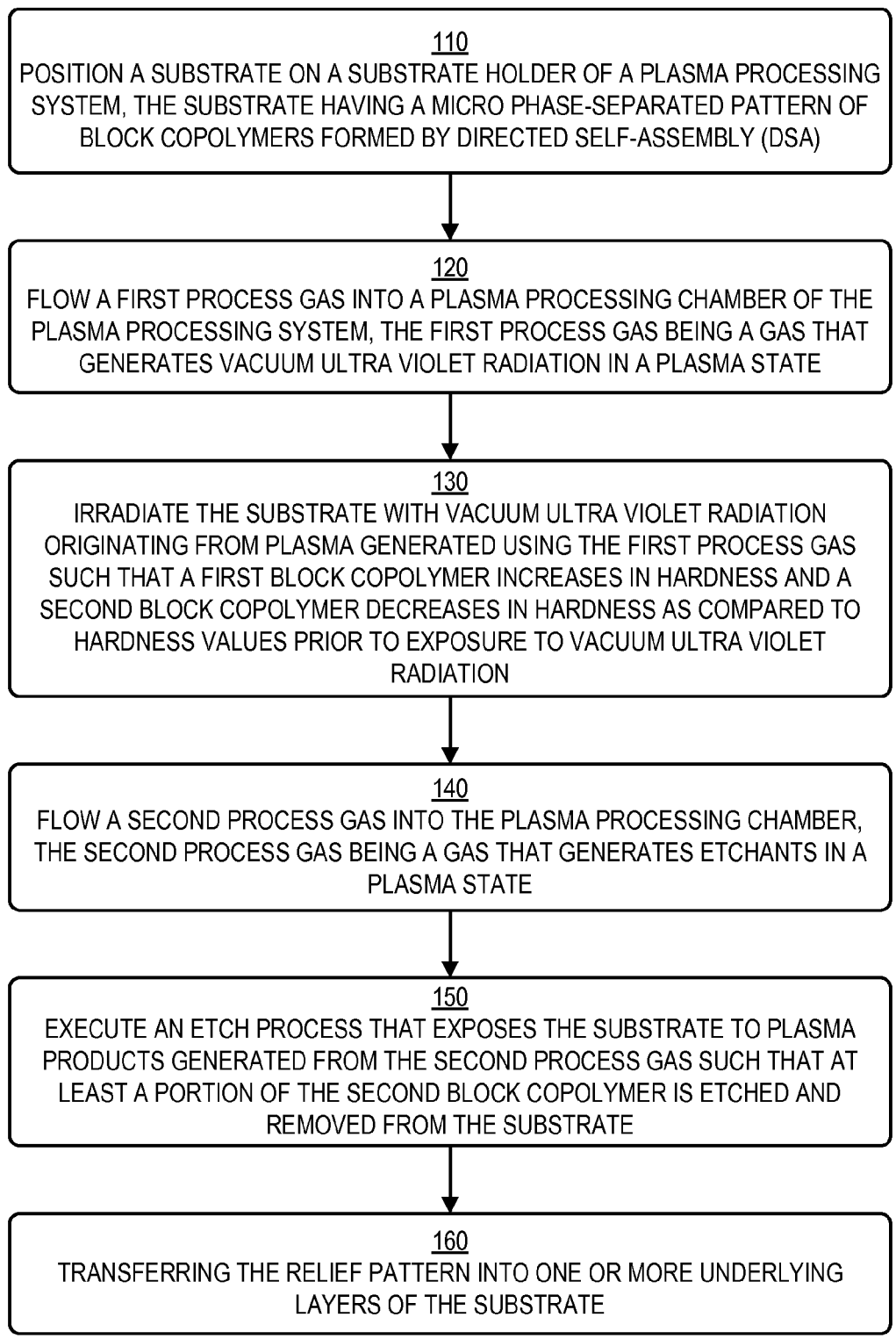
FIG. 1 is a flow chart of a substrate processing method according to embodiments disclosed herein.
Figure 2:
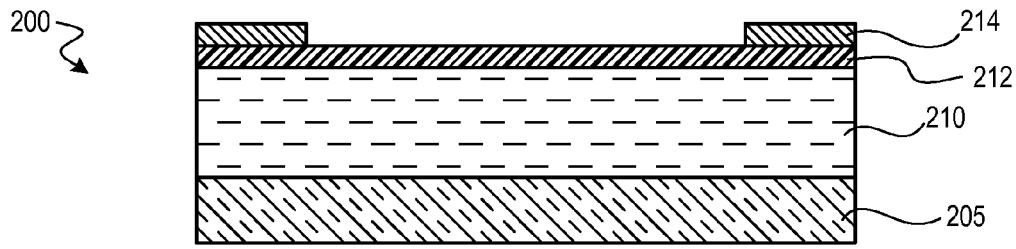
FIG. 2 is a cross-sectional schematic view of an example substrate segment showing a process flow according to embodiments disclosed herein.

Referring now to FIG. 1, a flow chart describes one example embodiment of DSA curing and patterning. In step 110 a substrate is positioned on a substrate holder of a plasma processing system. For example, a wafer can be loaded into a plasma processing chamber of a semiconductor plasma processing system. The substrate has a micro phase-separated pattern of block copolymers formed by directed self-assembly (DSA). FIG. 2 shows a cross-sectional segment of example substrate 200 prior to receiving a block copolymer film. Substrate 200 can include a pre-pattern layer 214. The pre-pattern layer 214 can be tuned to a particular set of block copolymers to help direct assembly or phase separation of block copolymers. Pre-pattern layer 214 can include graphoepitaxy or chemoepitaxy techniques. Antireflective coating layer 212, can assist with patterning and one or more photo resist layers that were developed prior to deposition of a block copolymer mix. Pre-patterning can include using conventional photolithography techniques as well as using extreme ultraviolet lithography (EUV). Target layer 210 is an underlying layer that can include multiple different types of layers. Layer 205 can include additional underlying layers.

Figure 3:
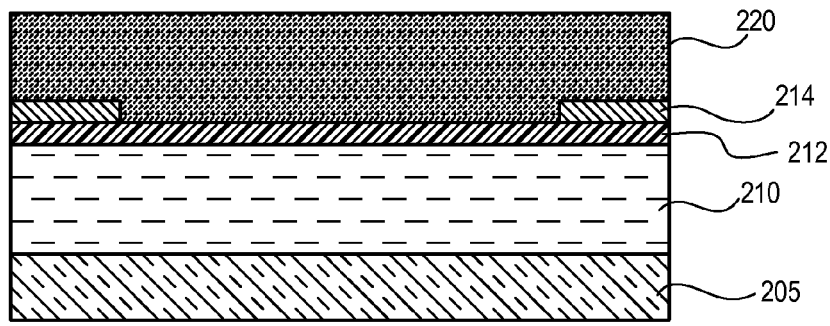
FIG. 3 is a cross-sectional schematic view of an example substrate segment showing a process flow according to embodiments disclosed herein.
Figure 4:
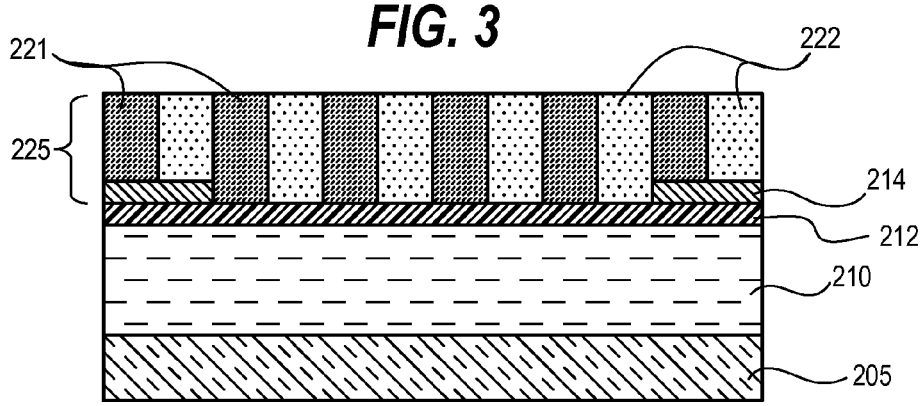
FIG. 4 is a cross-sectional schematic view of an example substrate segment showing a process flow according to embodiments disclosed herein.

A block copolymer layer 220 is then deposited on substrate 200. FIG. 3 shows an example block copolymer layer 220 deposited on substrate 200. Conventionally, a layer of block copolymers is typically deposited in liquid form using a spin-on technique. In some embodiments multiple different copolymers can be used. In a common example two block copolymers are included. In block copolymer layer 220 there is a mix of a first block copolymer and a second block copolymer. These two block copolymers can be evenly mixed throughout the layer. By way of a non-limiting example, a first block copolymer can be polystyrene, and a second block copolymer can be polymethyl methacrylate. Block copolymer layer 220 can be activated such that block copolymers separate from each other and group with like copolymers on a microscopic scale. This phase separation or assembly of like copolymers is directed by characteristics of the pre-pattern layer 214. Depending on types of block copolymers used and type of pre-pattern on a neutral layer, the block copolymers can phase separate into organized structures. Typically such structures include either lines or cylinders. As lines, the block copolymers alternate with each other to assemble into a repeating pattern of alternating lines. As cylinders, an array of cylindrical structures comprising one block copolymer can be surrounded by the other block copolymer. Phase-separation can be activated by one or more techniques. One activation technique is that of applied heat which, after reaching a particular threshold temperature, the block copolymers begin to micro phase-separate and assemble themselves into a repeating pattern. FIG. 4 shows an example phase-separated pattern layer 225 that includes first block copolymer 221 and second block copolymer 222.

In step 120, a first process gas is flowed into a plasma processing chamber of the plasma processing system. The first process gas is a gas that generates vacuum ultra violet radiation in a plasma state. Note that plasma processing systems are well known in the semiconductor fabrication industry. There are various different types of plasma processing systems that are suitable for generating vacuum ultraviolet radiation.

Figure 5:
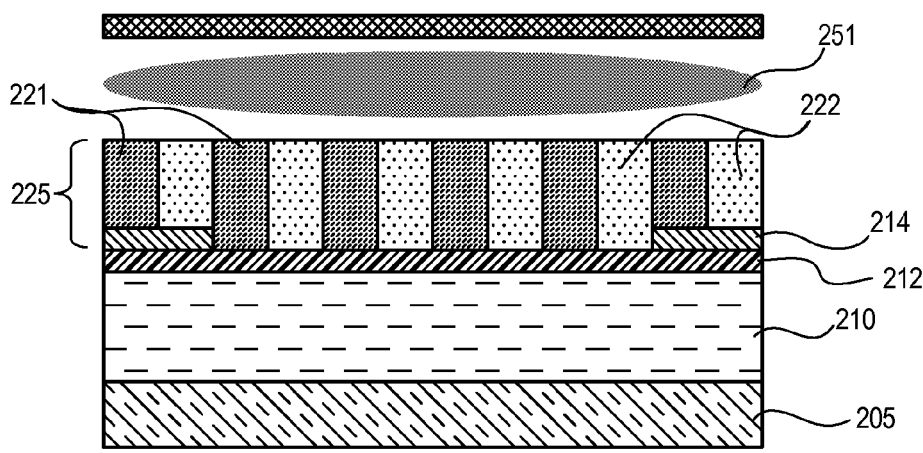
FIG. 5 is a cross-sectional schematic view of an example substrate segment showing a process flow according to embodiments disclosed herein.

In step 130, the substrate is irradiated with vacuum ultraviolet radiation originating from plasma generated using the first process gas such that a first block copolymer 221 increases in hardness and a second block copolymer 222 decreases in hardness as compared to respective hardness values prior to exposure to vacuum ultra violet (VUV) radiation. FIG. 5 shows substrate 200 being exposed to plasma 251 which includes a source of vacuum ultraviolet radiation. VUV radiation, for example, can cause cross-linking of polystyrene material, while simultaneously removing cross-linking of PMMA material. In other words, the VUV breaks down PMMA material making it weaker, while doing the opposite for polystyrene. The result is that polystyrene material becomes more etch resistant while PMMA material becomes less etch resistant. The vacuum ultraviolet radiation can include light with wavelengths between about 105 nanometers and 165 nanometers. In some embodiments, the first process gas includes at least one gas selected from the group consisting of He, Ar, H2, N2, HBr, and COS.

In step 140 a second process gas is flowed into the plasma processing chamber. The second process gas is a gas that generates etchants in a plasma state. There are many different etchants or combinations of etchants that can be used. Etching gases are known to those in the field of semiconductor fabrication, and particular gas selections can be based on type of polymer material being etched. Chloro fluoro carbons are common gases conventionally used. Example gases for etching can include H2, Ar, H2, O2, CO2, CO, COS, SO2, N2, NO2 and NH3.

Figure 6:
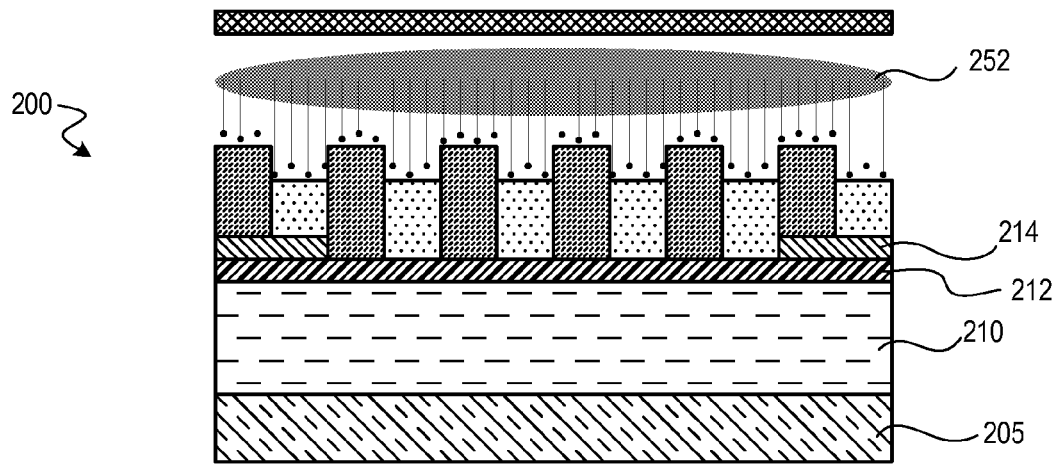
FIG. 6 is a cross-sectional schematic view of an example substrate segment showing a process flow according to embodiments disclosed herein.
Figure 7:
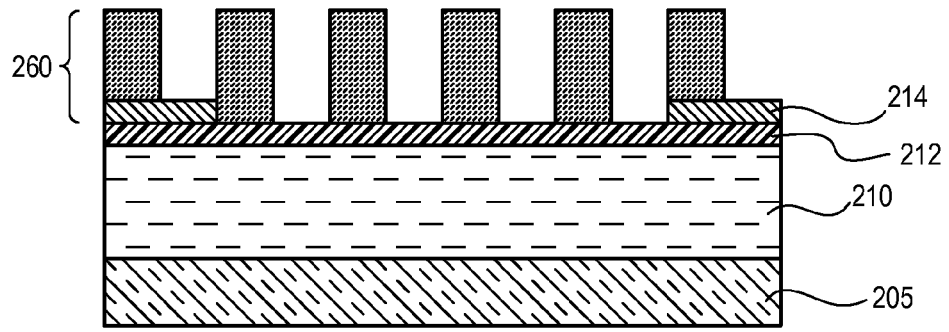
FIG. 7 is a cross-sectional schematic view of an example substrate segment showing a process flow according to embodiments disclosed herein.

In Step 150, an etch process is executed that exposes the substrate to plasma products generated from the second process gas such that at least a portion of the second block copolymer is etched and removed from the substrate. Executing the etch process can include executing a reactive ion etching treatment or ashing treatment. FIG. 6 illustrates an example etching process in which products from plasma 252 are directed toward substrate 200 to react with and etch second block copolymer 222. The etch process can be continued until the second block copolymer is removed from the substrate and a relief pattern 260 is defined by the first block copolymer 221. In other embodiments, products from plasma 252 etch the second block copolymer without adding substrate bias, thereby creating isotropic etching. FIG. 7 shows an example result of a completed curing and etching process in which relief pattern 260 includes a set of lines.

Some embodiments herein can cycle between irradiating the substrate with vacuum ultra violet radiation and executing the etch process for incremental removal of material. In some applications, cycling can be beneficial especially when VUV radiation cannot completely penetrate a given thickness of block copolymers. As such, VUV radiation cures a top portion of the block copolymers. This top portion is then etched, after which gases are switch to VUV-generating gases to cure the block copolymers again. After the second cure treatment, a second etching process is executed. Cycling can be configured such that each cycle etches a thickness of the second block copolymer that is between 1-10 nanometers. In some embodiments cycling is continued until the second block copolymer is removed from the substrate and a relief pattern is defined by the first block copolymer. Depending on a given thickness of block copolymers, there can be numerous cycles of curing and etching.

In other embodiments, deep ultraviolet (DUV) light from a lamp source can be used followed by a dry etch process. When vacuum ultraviolet light is used, etching of one of the block copolymers is typically more effective when executed with a dry etch operation. Because VUV radiation can be created in a plasma processing chamber using ions and plasma products, there can be some deposition on the substrate, which can subsequently be broken through using a dry etch process. In other words, VUV can cause a crust to form that can prevent etching by liquid or dry chemicals. This crust can be etched or otherwise removed to continue pattern creation.

Figure 8:
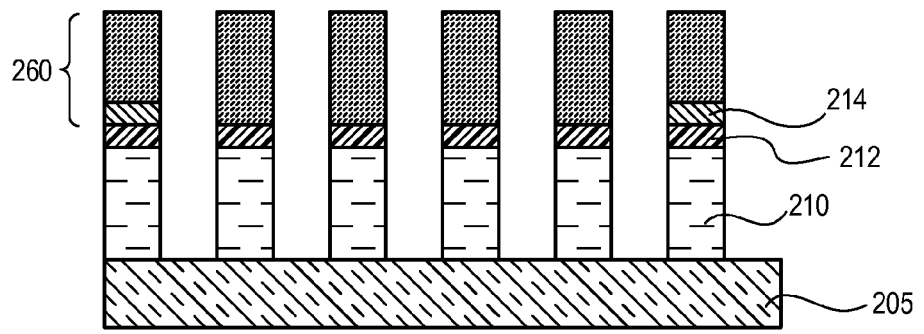
FIG. 8 is a cross-sectional schematic view of an example substrate segment showing a process flow according to embodiments disclosed herein.
Figure 9:
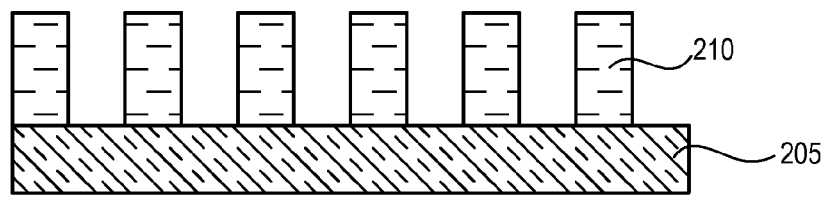
FIG. 9 is a cross-sectional schematic view of an example substrate segment showing a process flow according to embodiments disclosed herein.

In step 160, the relief pattern 260 is transferred into one or more underlying layers of the substrate, such as target layer 210. FIG. 8 shows an example result of transferring the relief pattern 260 into underlying layers. Thus, with second block copolymer 222 removed, relief pattern 260 can be used as a mask for etching one or more underlying layers. After completing an etch transfer, the first block copolymer 221 and pre-pattern layers can be removed. FIG. 9 shows substrate 200 having defined structures on the target layer 210. The structures can be built upon or used for subsequent processing, pattern transfer, etc. Note that by hardening the first block copolymer 221, a benefit is improved line edge roughness and/or line width roughness. This improved LER/LWR translates into better results with pattern transfer.

Accordingly, curing techniques herein can enable effective use of directed self-assembly as a patterning technique.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of processing a substrate, the method comprising:
    positioning a substrate on a substrate holder of a plasma processing system, the substrate having a micro phase-separated pattern of block copolymers formed by directed self-assembly (DSA);
    flowing a first process gas into a plasma processing chamber of the plasma processing system, the first process gas being a gas that generates vacuum ultra violet radiation in a plasma state;

irradiating the substrate with vacuum ultra violet radiation originating from plasma generated using the first process gas such that a first block copolymer increases in hardness and a second block copolymer decreases in hardness as compared to respective hardness values prior to exposure to vacuum ultra violet radiation;

flowing a second process gas into the plasma processing chamber, the second process gas being a gas that generates etchants in a plasma state; and executing an etch process that exposes the substrate to plasma products generated from the second process gas such that at least a portion of the second block copolymer is etched and removed from the substrate.

2. The method of claim 1, further comprising:

continuing the etch process until the second block copolymer is removed from the substrate and a relief pattern is defined by the first block copolymer.

3. The method of claim 2, further comprising:

transferring the relief pattern into one or more underlying layers of the substrate.

4. The method of claim 1, further comprising:

cycling between irradiating the substrate with vacuum ultra violet radiation and executing the etch process.

5. The method of claim 4, wherein cycling is continued until the second block copolymer is removed from the substrate and a relief pattern is defined by the first block copolymer.

6. The method of claim 5, further comprising:

transferring the relief pattern into one or more underlying layers of the substrate.

7. The method of claim 4, wherein cycling is continued until the second block copolymer is removed from the substrate and an underlying layer is revealed.

8. The method of claim 4, wherein cycling is executed such that each cycle etches a thickness of the second block copolymer that is between 1-10 nanometers.

9. The method of claim 1, wherein executing the etch process includes executing a reactive ion etching or ashing treatment.

10. The method of claim 1, wherein the first block copolymer is polystyrene.

11. The method of claim 1, wherein the second block copolymer is polymethyl methacrylate.

12. The method of claim 1, wherein the micro phase-separated pattern of block copolymers includes alternating linear structures.

13. The method of claim 1, wherein the micro phase-separated pattern of block copolymers includes an array of cylindrical structures.

14. The method of claim 1, wherein the first process gas includes at least one gas selected from the group consisting of He, Ar, $H_2$, $N_2$, HBr, and COS.

15. The method of claim 1, wherein the vacuum ultraviolet radiation includes light with wavelengths between about 105 nanometers and 165 nanometers.

16. The method of claim 1, wherein the second process gas includes at least one gas selected from the group consisting of H2, Ar, H2, O2, CO2, CO, COS, SO2, N2, NO2 and NH3.

17. The method of claim 1, wherein the substrate is initially patterned using extreme ultraviolet light or an electron beam.

* * * * *